United States Patent [19]

Simi et al.

[11] 4,142,199
[45] Feb. 27, 1979

[54] BUCKET BRIGADE DEVICE AND PROCESS

[75] Inventors: Victor M. Simi, Lexington, Ky.; Donald A. Soderman, Vienna, Va.

[73] Assignee: International Business Machines Corporation, Armonk, N.Y.

[21] Appl. No.: 809,876

[22] Filed: Jun. 24, 1977

[51] Int. Cl.² .................... H01L 29/78; H01L 29/06; G11C 19/28
[52] U.S. Cl. ...................... 357/24; 357/55; 357/91; 307/221 D
[58] Field of Search .................. 357/24, 55, 91; 307/221 D

[56] References Cited

U.S. PATENT DOCUMENTS

| | | | |
|---|---|---|---|
| 3,650,019 | 3/1972 | Robinson | 357/23 |
| 3,767,983 | 10/1973 | Berglund | 357/24 |
| 3,848,328 | 11/1974 | Ando et al. | 357/24 |
| 3,874,955 | 4/1975 | Arita | 357/23 |
| 4,045,810 | 8/1977 | Butler et al. | 357/24 |
| 4,065,783 | 12/1977 | Ouyang | 357/55 |
| 4,078,947 | 3/1978 | Johnson et al. | 357/91 |

OTHER PUBLICATIONS

Rideout, "Self-Aligned Bucket Brigade Device Structure...", IBM Tech. Disclosure Bulletin, vol. 19, (Jun. 1976), pp. 359-361.
Tasch et al., "The Charge-Coupled RAM Cell Concept", IEEE Transactions on Electron Devices, vol. ED-23, (2/76), pp. 126-131.
Abbas et al., "Hot-Carrier Instability in IGFET's", Applied Physics Letters, vol. 27, (Aug. 1, 1975), pp. 147-148.

Primary Examiner—William D. Larkins
Assistant Examiner—Gene M. Munson
Attorney, Agent, or Firm—John E. Hoel

[57] ABSTRACT

The invention is the structure and process for making a bucket brigade device which comprises the merger of an MOS capacitor with an MOSFET device to form the charge transfer cell. A thin n-type region is implanted in a portion of the p-type channel region of an FET device adjacent to the drain diffusion. This structure increases the charge transfer efficiency for the cell and reduces its sensitivity of the threshold voltage to the source-drain voltage. The gate for the device has a substantial overlap over the drain and a minimal overlap over the source and the gate to drain capacitance per unit area is maximized by maintaining a uniformly thin oxide layer across the gate region.

10 Claims, 15 Drawing Figures

BUCKET BRIGADE DEVICE AND PROCESS

FIELD OF THE INVENTION

The invention disclosed relates to semiconductor devices and fabrication processes and more particularly relates to improvements in bucket brigade devices and processes for making same.

BACKGROUND OF THE INVENTION

A bucket brigade circuit is a sequence of switching transistors interconnecting capacitive storage nodes, with the gates of alternate transistors in the sequence being driven by non-overlapping clock pulses. Bucket brigade circuits may be embodied advantageously in field effect transistor technology providing a bucket brigade cell which is simple in structure and manufacture. A voltage (charge) signal representative of the unit of binary information is introduced at the source of a first one of the FET bucket brigade cells. When the clock pulse on the gate of the first bucket brigade cell appears, it bootstraps the previously restored drain node causing current to flow through the FET device and the unit of binary information is transferred to the storage capacitance between the first cell and the second cell. Thereafter, when the clock pulse on the gate of the second bucket brigade cell appears, the unit of binary information stored at the capacitive node between the first cell and the second cell is then transferred through the second cell to the restored capacitive node between the second cell and the third cell. In this manner, a voltage (charge) signal may be transferred through a string of bucket brigade cells using a two phase clock to accomplish a serial storage, signal transfer, or signal processing operation. This operation is shown schematically in FIG. 1d. For each transfer there is always one cell which was intially empty of propagated charge. This empty cell is restored to a reference potential at the last device in a string and is essentially propagated in the reverse direction of information flow. Thus, for a two phase clock one needs 2N cells to store N bits of information. The number of cells can be reduced to $$\frac{(m)}{m-1}$$

for a multi (M) phase clock storing N bits of information.

A successful bucket brigade cell design must possess a number of attributes. Since bucket brigade cells are not used in isolation but are used in chain like configurations employing large numbers thereof, the cell must be of small dimension and be amenable to fabrication in high density integrated circuit arrangements. Since long chains of these cells are required for many applications, the transfer efficiency of each cell must be very close to unity and that transfer efficiency must not be different between that for the transfer of a binary zero signal and that for the transfer of a binary one signal.

A typical prior art implementation of a bucket brigade cell is shown in FIG. 1a with a cross section of the cell along line 1b shown in FIG. 1b and a cross section of the cell along the line 1c shown in FIG. 1c. The bucket brigade cell shown in FIGS. 1a-1c is of the metal gate type, which, although not having a self-aligned gate, utilizes a more simplified fabrication process than polycrystalline silicon self-aligned gate devices do, resulting in a more planar surface contour on which finer resolution photolithography can be performed. The prior art bucket brigade cell is formed as part of an integrated circuit in a p-type semiconductor substrate 2 and has an n+ type diffusion 4 which serves as its capacitive storage node. Under the thick oxide layer 6 in FIG. 1b, is the diffusion 4' whose right hand side serves as the source in the bucket brigade device 12 and whose left hand side serves as a portion of the drain for the bucket brigade device to the left of device 12. Generally, the prior art bucket brigade cell shown in FIG. 1b has a thick layer 6 of silicon dioxide which serves to separate the gates 12 and 14 of adjacent bucket brigade cells. Formed between the thick layers 6 of silicon dioxide is a thinner layer of silicon dioxide which consists of a relatively thinner portion 8 having a thickness typically on the order of 500 to 1000 Angstroms and a relatively thicker portion 10 having a thickness generally on the order of 1000 to 1500 Angstroms. The gate metal 12 of the bucket brigade cell is formed between the thick layers 6 of silicon dioxide over the thin oxide layers 8 and 10. Differential oxide thickness beneath the gate electrode 12 of a non-self-aligned gate FET device, in the region 3 between regions 6 and 8 of FIG. 1b, is desirable as taught in the prior art, to reduce parasitic capacitive coupling between the gate 12 and source 4' diffusion. Indeed, such devices are desired to be present on the LSI chip, which may also contain a bucket brigade chain, in order to perform other logical and input/output operations. The prior art process for forming the thicker region 3 relies on the enhanced oxidation rate of heavily doped silicon, such as the diffusion 4'. However, with this benefit comes the detriment of the growth of a corresponding thicker oxide layer 10 over the diffusion 4, which also reduces the capacitance between the gate 12 and the diffusion 4. The detrimental effect of this occurs when the FET device is employed as an element in a bucket brigade chain, since the charge storage node of the cell formed between the gate and diffusion will have a reduced capacitance per unit area.

The capacitive storage portion of the bucket brigade cell generally is located at the portion of the thin oxide layer 10 and the field effect switching portion of the bucket brigade cell is generally localized at the portion 8 of the thin oxide layer. This prior art bucket brigade cell suffers defects which are typical of the prior art. The prior art has not recognized nor solved the problem of including on the same IC chip both differential oxide FET logic devices and bucket brigade devices having a minimized thickness of the silicon dioxide layer 10 in the capacitive storage region, to maximize the capacitance per unit area thereof while at the same time maximizing the thickness of the oxide in region 3, in FIG. 1b, to minimize capacitive coupling to the source. Charge propagation along a bucket brigade chain as shown in FIG. 1d, is the result of a capacitive bootstrapping operation, where the magnitude of charge propagated from node-to-node is a function of the difference in magnitude between the gate-to-source capacitance $C_{gs}$ and the gate-to-drain capacitance $C_{gd}$. The larger $C_{gd}$ is with respect to $C_{gs}$, the larger will be the magnitude of the charge transferred. Since the minimum capacitance per bucket brigade cell is required to achieve a detectable output signal for a particular application, the cell must be made larger in area to meet the capacitance requirement.

Still other problems with the prior art bucket brigade cell, as is typified by that shown in FIGS. 1a–1c, revolve about the inability to provide for self-alignment of the structural elements of the bucket brigade cell so that the spacing X which is required for alignment tolerance between the diffusion 4 and the gate oxide etching levels force the designer to make the separation distance wide between adjacent chains of bucket brigade cells larger. Still another set of problems associated with the prior art bucket brigade device cells concerns channel shortening effects which occur when adjacent cells within the same bucket brigade chain are brought too closely together. Because of the substantial vertical depth of the diffusion 4 in FIG. 1b as it faces the channel region between the diffusion 4 and the diffusion 4', as the separation distance between the diffusions 4 and 4' is reduced, the threshold voltage for the field effect transistor portion of the bucket brigade device beneath the thin oxide layer 8 becomes sensitive to the magnitude of the voltage difference between the diffusions 4 and 4'. This causes the threshold voltage, and therefor the charge transfer efficiency of the device to be different for binary one signals than it would be for binary zero signals. Since the threshold voltage and charge transfer efficiency has become dependent upon the logical value of the signal transferred, long chains of such bucket brigade cells will introduce a degradation in the signal transferred especially apparent in the first different bit in a sequence.

OBJECTS OF THE INVENTION

It is therefore an object of the invention to increase the circuitry density of a bucket brigade device circuit.

It is another object of the invention to reduce the sensitivity of the threshold voltage of a bucket brigade device to the source-to-drain voltage magnitude.

It is yet another object of the invention to minimize the overlap capacitance of the gate to the source and maximize the overlap capacitance of the gate to the drain in the bucket brigade device.

It is still another object of the invention to reduce the short channel effect problems in a bucket brigade device.

It is yet a further object of the invention to provide, on the same IC chip, FET logic devices having reduced parasitic capacitances and bucket brigade devices having a maximized gate-to-drain capacitance per unit area.

SUMMARY OF THE INVENTION

These and other objects, features and advantages are accomplished by the improved bucket brigade device and process disclosed herein. The invention is the structure and process for making a bucket brigade device which comprises the merger of an MOS capacitor with an MOSFET device to form the charge transfer cell. A thin n-type region is implanted in a portion of the p-type channel region of an FET device adjacent to the drain diffusion. This structure increases the charge transfer efficiency for the cell and reduces its sensitivity of the threshold voltage to the source-drain voltage. The gate for the device has a substantial overlap over the drain and a minimal overlap over the source, and the gate-to-drain capacitance per unit area is maximized by maintaining a uniformly thin oxide layer across the gate region. Thus, bucket brigade devices having a maximized gate-to-drain capacitance per unit area can be formed on the same IC chip with FET logic devices having reduced parasitic capacitances.

DESCRIPTION OF THE FIGURES

These and other objects, features and advantages of the invention will be more readily appreciated with reference to the accompanying figures.

FIG. 1d is an electrical schematic diagram of the bucket brigade device chain of FIG. 1a.

FIG. 2d is an electrical schematic diagram of the improved bucket brigade device chain of FIG. 2a.

FIGS. 3a–3e illustrate the sequence of process steps necessary to fabricate the first embodiment of the invention shown in FIG. 2a.

FIG. 5 is a graphical representation of the relationship between transfer loss per stage versus the effective channel length for the bucket brigade device of the first embodiment of FIG. 2a.

DISCUSSION OF THE PREFERRED EMBODIMENT

Figure 1A:
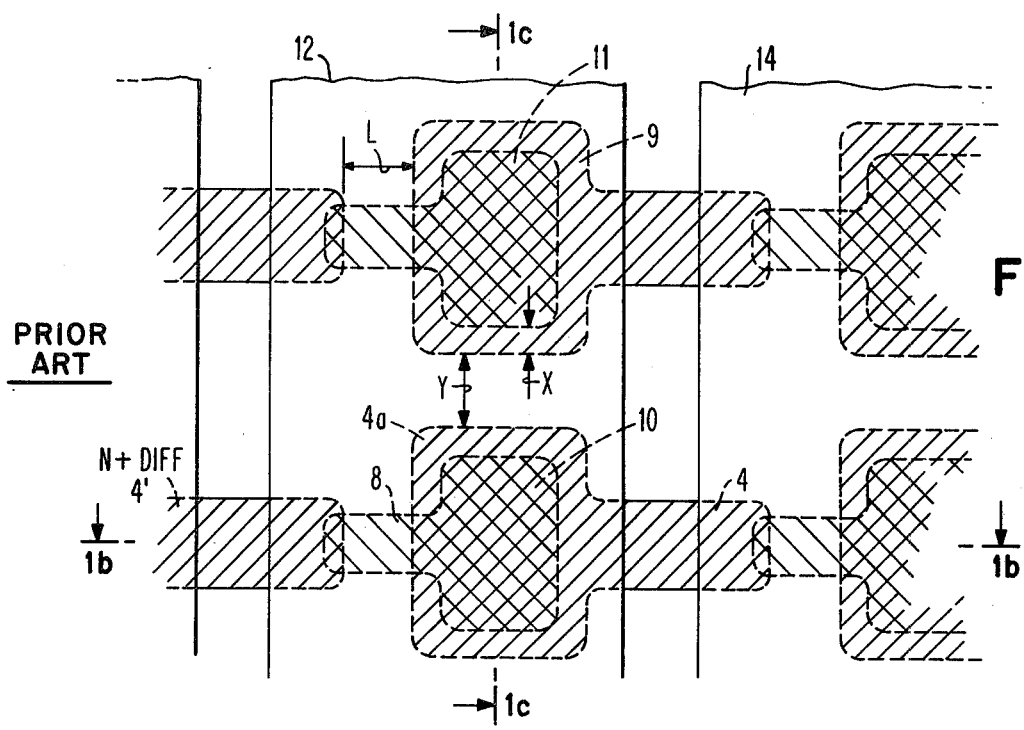
FIG. 1a is a plan view of a prior art bucket brigade device.
Figure 1B:
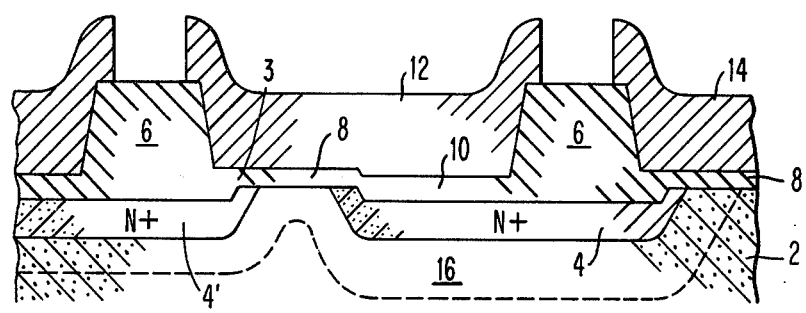
FIG. 1b is a cross-sectional view of FIG. 1a along line 1b.
Figure 1C:
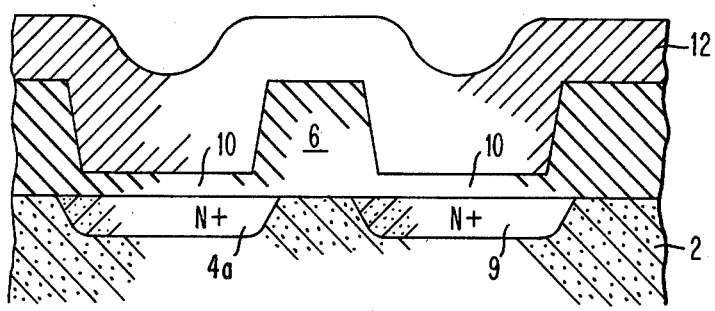
FIG. 1c is a cross-sectional view of FIG. 1a along line 1c.
Figure 1D:
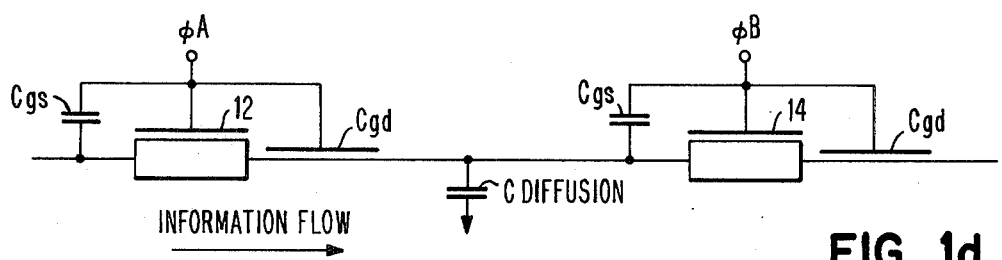
Figure 2A:
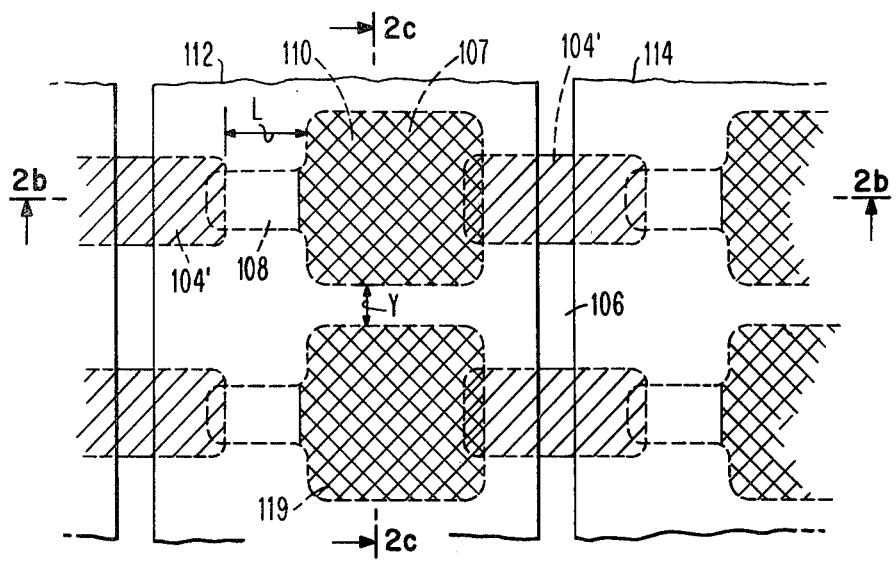
FIG. 2a is a plan view of a first embodiment of the invention showing the improved bucket brigade device with a single implanted drain extension.
Figure 2B:
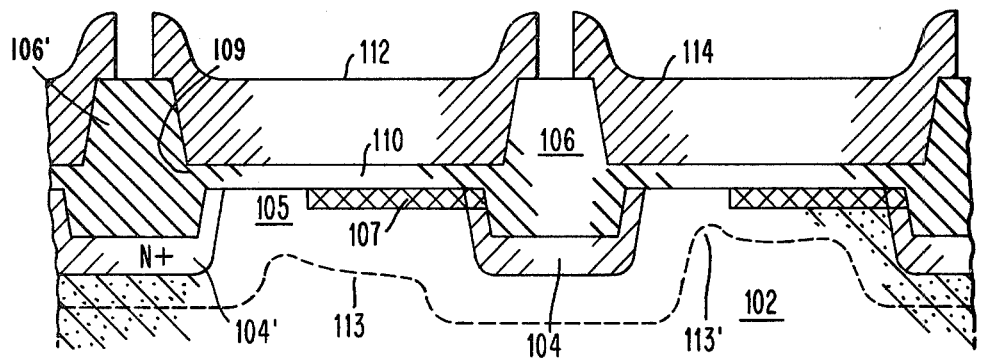
FIG. 2b is a cross-sectional view of FIG. 2a along line 2b.
Figure 2C:
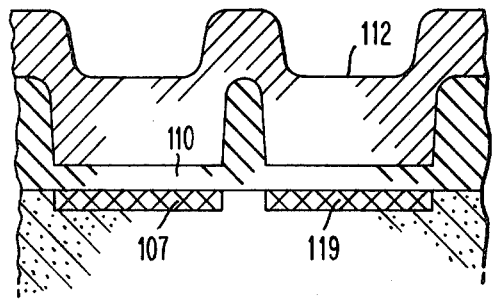
FIG. 2c is a cross-sectional view of FIG. 2a along line 2c.
Figure 2D:
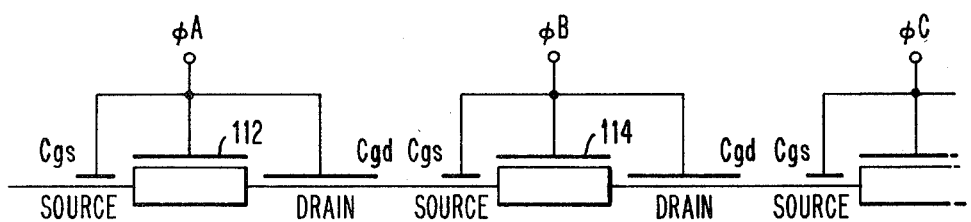

To obtain optimum performance for a bucket brigade device, the thin overlap capacitance of the gate and drain should be maximized while minimizing the parasitic capacitances of the gate-to-source and the diffusion to the substrate. In addition, the current-voltage characteristics, which are related to the threshold voltage of the field effect transistor, should be independent of the drain-to-source voltage and should have high on-state conductance for maximum transfer efficiency at low and high operating frequencies. In addition, the bucket brigade device structure must be capable of being packed into the smallest area possible with a minimum spacing for optimum bit density and semiconductor chip yield. The bucket brigade cells shown in FIGS. 2a–2c achieve all of these criteria for an improved bucket brigade device. FIG. 2a is a plan view of the first embodiment of the invention showing the improved bucket brigade device with an ion-implanted drain extension. FIG. 2b is a cross-sectional view of FIG. 2a along the line 2b. FIG. 2c is a cross-sectional view of FIG. 2a along line 2c. FIG. 2d is a schematic circuit diagram of the device of FIG. 2a. The improved bucket brigade device cell shown in FIGS. 2a–2c merges the capacitive storage region with the field effect transistor switching region by employing a uniform thickness of thin oxide layer 110 through which a drain extension 107 is ion-implanted to form the capacitive storage node for the bucket brigade cell.

FIGS. 2a and 2b show a serially connected sequence of bucket brigade cells whereas FIG. 2c shows one cell from each of a pair of adjacent bucket brigade chains. The cells are formed as elements of an integrated circuit in a p-type semiconductor substrate 102 having a resistivity between 1.3 and 1.7 ohm centimeters. This low resistivity substrate helps to reduce channel shortening and electrostatic feedback effects, which reduces the sensitivity of the threshold voltage to the source-to-drain voltage.

A first source region 104 for a first cell indicated by the gate 112, is formed in the semiconductor surface, having an n-type conductivity by doping the substrate with phophorus or arsenic.

A second source region 104' for a second cell to the left of the first cell in FIG. 2b is formed as a n-type diffusion in the p-type substrate and is spaced from the first source region 104 so that the region of the substrate therebetween will form the capacitive storage node for the first cell and the field effect transistor switching device for the first cell. A thick silicon dioxide layer 106 is formed over the source regions 104 and 104'. A thin oxide layer 110 having a uniform thickness is formed over the semiconductor substrate 102 in the region between the thick oxide layers 106. A transitional oxide region 109 between the thin oxide layer 110 and the thick oxide layer 106' beneath the gate electrode 112, has a greater thickness than the thin oxide layer 110 to reduce the parasitic capacitance between the gate 112 and the source 104'. A drain extension 107 is ion-implanted with n-type dopant such as phosphorous or arsenic, through the thin oxide layer 110 so as to occupy a portion of the total distance between the sources 104 and 104', leaving a channel region 105 having the original substrate conductivity concentration and type between the implanted drain extension 107 and the source 104'. The thickness of the ion-implanted drain extension 107 is substantially thinner than is the depth of the source 104 or 104' beneath the surface of the semiconductor's substrate 102, and can range from about 500 Angstroms to 2000 Angstroms.

For the device 112 of FIG. 2b, having a center-to-center spacing between the thick oxide layers 106 and 106' (cell periodicity) of 20 microns, the depth of the source diffusion 104 beneath the surface of the substrate is about 1.9 microns, the depth of the implanted drain extension 107 is about 1000 Angstroms, the length of extension 107 is about 8 microns, the length of channel region 105 is about 5 microns, the depth of thick oxide layer 106 is about 3000 Angstroms beneath the substrate surface, and the thickness of the thin oxide layer 110 is about 500 Angstroms. A metal gate 112 is formed over the thin oxide layer 110, thereby completing the structure shown in FIGS. 2a–2c.

Figure 3A:
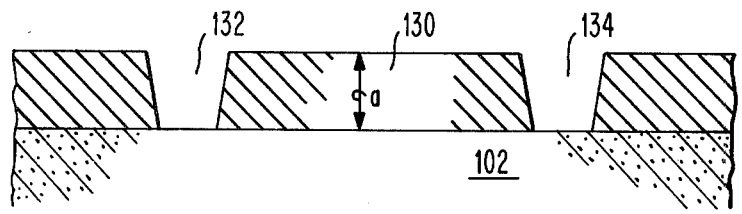
Figure 3B:
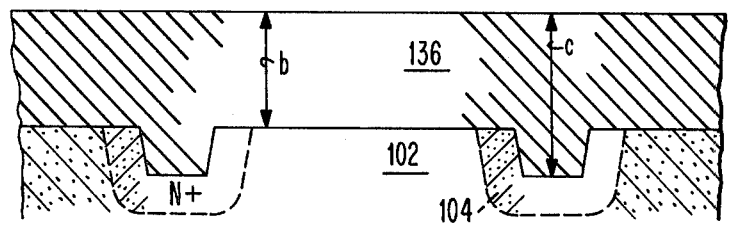

The process for forming the improved bucket brigade cell shown in FIGS. 2a–2c, is illustrated in FIGS. 3a–3e. The process commences with FIG. 3a which takes a p-type silicon substrate 102 of 1.5 ohm centimeters and grows an initial oxide layer 130 of a = 3000 Angstroms thickness by a conventional thermal oxidation process. Holes 132 and 134 are then etched through the oxide layer 130. The source diffusions 104 and 104' are then formed by depositing/growing a 5 mole percent phosphosilicate glass over the thermal oxide layer 130 and the exposed windows 132 and 134 at a temperature of 870° C. for approximately 25 minutes. This is followed by a source-drain drive-in cycle at 900° C. in a steam atmosphere for approximately 250 minutes. The resultant thickness of the phosphosilicate glass and thermally grown oxide over the source regions 104 and 104' is about c = 9500 Angstroms. The condition of the device at this point is shown in FIG. 3b, where the planar surface of the layer 136 provides an improved photolithographic resolution.

Figure 3C:
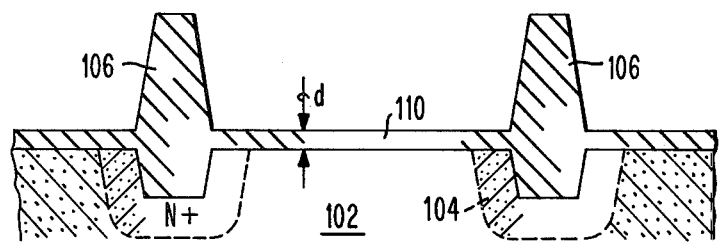

Thereafter, a photolithographic etching step is employed to form the thick oxide structures 106 and 106' shown in FIG. 3c. This is followed by a gate oxide growth step to form the thin oxide layer 110 shown in FIG. 3c by a dry thermal oxidation step at 900° C. for about 250 minutes.

A thin PSG layer is deposited/grown to 100 Angstroms thickness on the surface of oxide layer 110 and annealed at 1000° C. for 20 minutes to provide gettering for ionic contaminants for enhanced threshold voltage stability. The condition of the resulting device is shown in FIG. 3c.

Figure 3D:
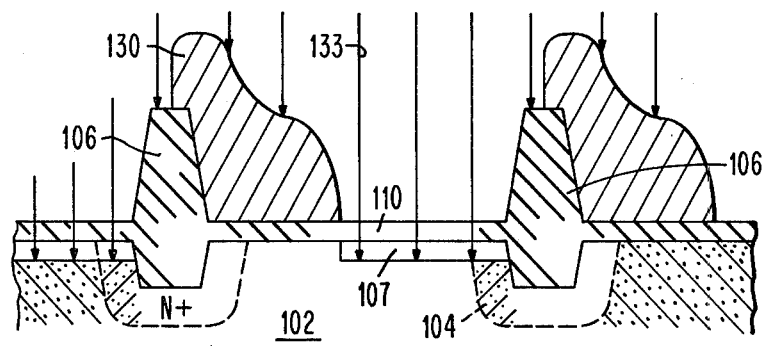

The next step involves depositing by conventional methods, a layer of photoresist 130 of about one micron thickness over a portion of the thin oxide layer 110 and the portion of an adjacent thick oxide structure 106' as shown in FIG. 3d to serve as an ion-implantation mask for the implantation of phosphorous ions at about 65 Kev. For a thin oxide layer 110 having a thickness of about 500 Angstroms, a 65 Kev phosphorous ion beam dose of $10^-$ atoms per square centimeter results in the n-type drain extension 107 shown in FIG. 3d, after annealing at 450° C. for ten minutes. This concentration for the drain extension 107 insures that it will remain n-type for all designed gate and drain potentials.

Figure 3E:
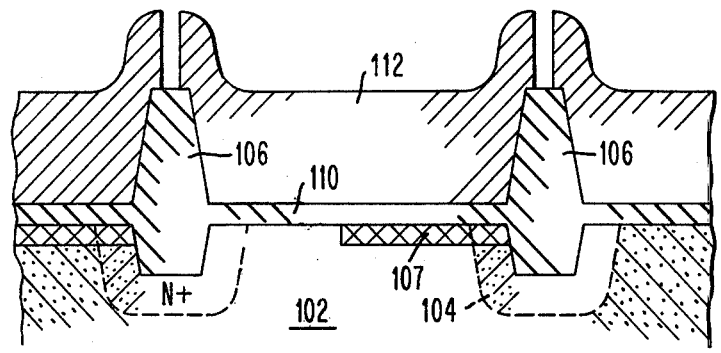

The final steps in FIG. 3e of photolithographic etching for contacts and depositing the metal gates 112 of aluminum-copper and etching the metal structures, complete the process.

During the sequence of process steps shown in FIGS. 3a–3e for forming the improved bucket brigade device structure, conventional FET logic devices have also been formed on the same IC chip, having reduced gate to diffusion capacitance by virtue of the difference in oxide thicknesses between their channel regions and their diffusion regions.

The bucket brigade cell of FIG. 2b improves the low frequency, transfer efficiency by minimizing the variation in threshold voltage with respect to changes in source-to-drain potential. This is accomplished in two ways, first by reducing the resistivity of the substrate and secondly by reducing the effective junction depth of the ion implanted high resistivity the portion of the drain nearest the channel. As the drain-to-substrate or drain-to-source voltage increases, the depletion layer at the p-n junction increases in width and, for the vertical side of the drain nearest the channel, effectively reduces the channel length by progressively encroaching into the channel region. As the designed separation distance between the source region surrounding the drain merges with a corresponding depletion region surrounding the source, forming a continuous depletion region beneath the gate, whose surface charge carrier concentration is less amenable to the voltage on the gate. This means that the threshold voltage has become sensitive to the source-to-drain voltage, the well recognized short channel effect.

By increasing the substrate doping conductivity, the rate of change on the drain depletion layer thickness with a change in drain-to-substrate voltage is reduced, thereby reducing the rate of change of the effective channel length with respect to the drain-to-substrate voltage, which in turn, reduces the sensitivity of the threshold voltage to the drain-to-substrate voltage.

By introducing the shallow, ion-implanted drain extension 107, the drain depletion layer is confined to a region surrounding the shallow extension 107, close to the surface of the substrate where much greater control over the charge carriers can be maintained by the gate. Since the merging of the depletion layers between the source and drain in the channel region occurs closer to the surface, as in a more ideal long channel FET, the threshold voltage is much less sensitive to variations in the drain-to-substrate or drain-to-source voltage change.

In a bucket brigade cell, an insensitivity of the threshold voltage to the source-to-drain or drain-to-substrate voltage is essential to consistently transfer the same quantity of charge for a given binary value, independent of the binary value of the preceding and succeeding charge signals. Such a dependence will result in a residual charge being left at the storage node for a first binary value, which then will be transferred with the charge signal for the opposite binary value, causing an erroneous accumulated charge amplitude to be propagated. Thus, by increasing the substrate conductivity and providing the ion-implanted drain extension 107 in accordance with the invention, the low frequency charge transfer efficiency for the bucket brigade cell is improved.

At high frequencies where the channel length governs the transit time for charge signal, the intrinsic transfer efficiency improves with the reduced channel resistance which is the concommitant of the reduced effective channel length and increased conductivity of the bucket brigade cell in accordance with the invention.

Figure 4:
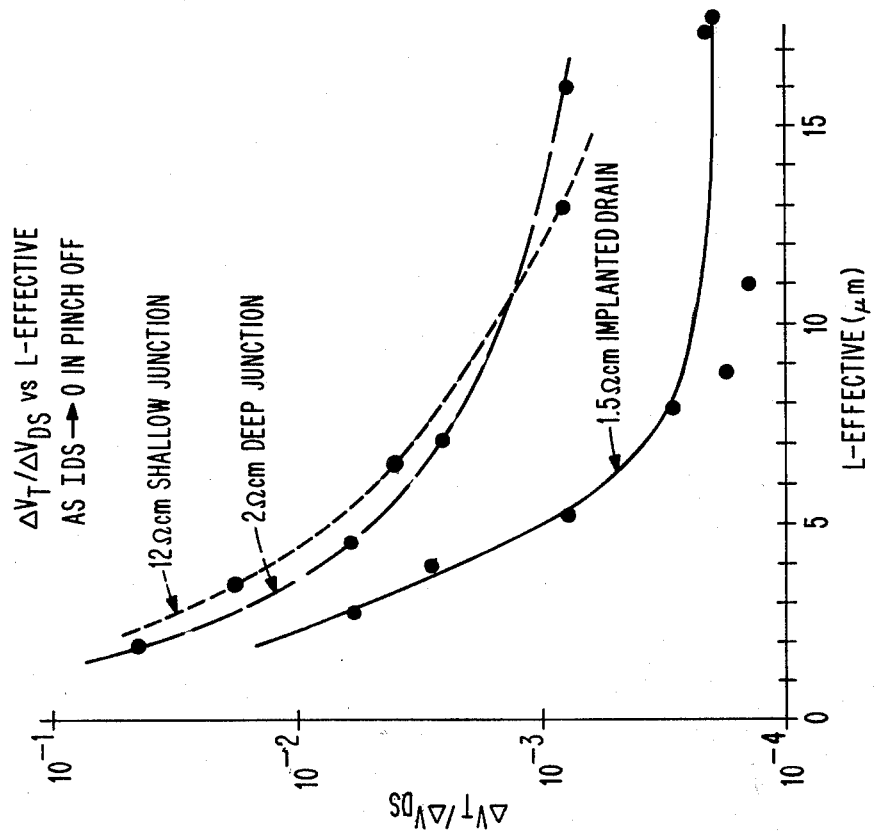
FIG. 4 is a graphical representation of the relationship between the sensitivity of a bucket brigade device's threshold voltage to the source-to-drain voltage versus the effective channel length for the device.

FIG. 4 represents the graphical relationship between the sensitivity of the threshold voltage to the drain-to-source voltage in the saturated BBD mode of operation as IDS goes to zero versus the effective designed channel length, for two conventional bucket brigade devices and the improved bucket brigade device according to the invention. The figure shows that a bucket brigade cell with a 1.5 ohm-centimeter substrate and an ion-implanted drain extension in accordance with the invention, has a substantially reduced threshold voltage sensitivity and therefor lower transfer loss than does either a bucket brigade cell with a 12 ohm-centimeter substrate and a shallow (0.8um) junction or a bucket brigade cell with a 2 ohm-centimeter substrate and a deep (2.7 um) junction.

Figure 5:
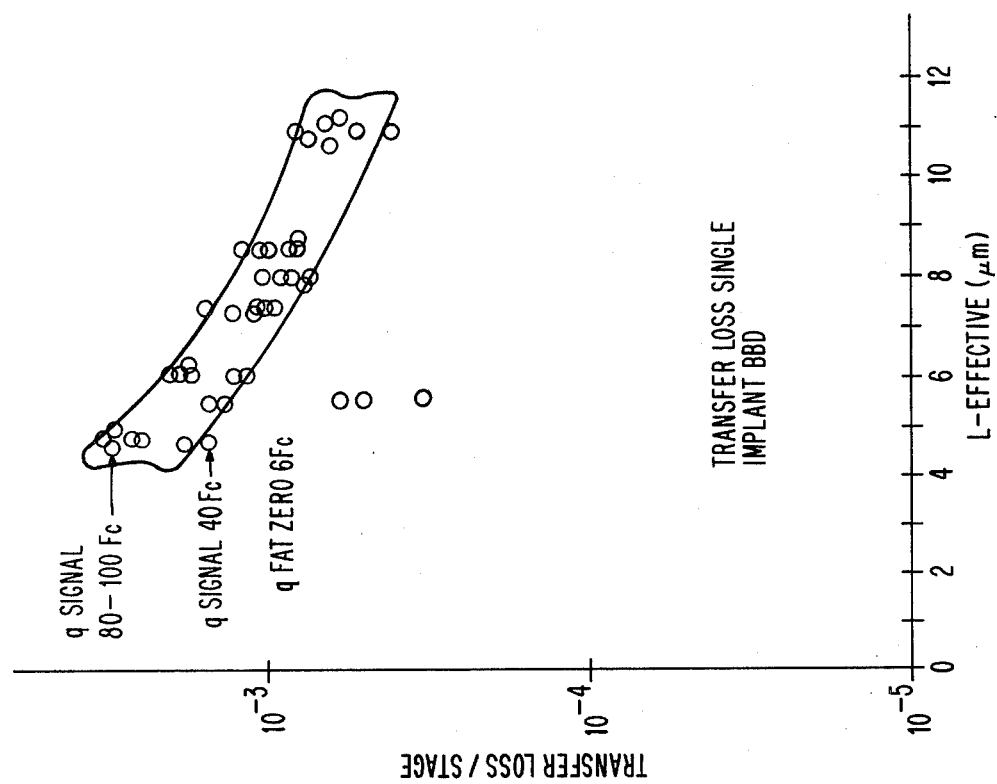

FIG. 5 represents the graphical relationship between the measured transfer loss/stage and the effective channel length for the invention at different signal levels at 200 KH$_z$. The measured transfer loss/stage includes both the loss due to threshold voltage sensitivity and losses due to all other sources. Devices according to the invention, having seven different designed channel lengths, were tested at different charge signal amplitudes ranging from 40 to 100 femto-coulombs ($\times 10^{-15}$ coulombs) and their resulting transfer loss per stage was measured. The graph shows that the dependence of charge transfer loss/stage on charge signal amplitude is relatively small and that total transfer loss/cell is sufficiently small to permit the concatenation of large numbers of the device cells without incuring significant signal distortion.

Charge transfer efficiency in a bucket brigade device is a function of the following factors:
 1. surface state loss due to trapping and charge leakage
 2. modulation of the threshold voltage by the drain-to-source voltage
 3. parasitic capacitance of the drain to the substrate
    a. causing capacitive loading on successive bucket brigade devices in a series, and
    b. causing capacitive loading on the $\phi A$ and $\phi B$ phase clock lines.

The improved bucket brigade device invention has an enhanced charge transfer efficiency by improving factors 2, 3a and 3b. The reduced sidewall area of the drain extension 107, facing the channel region 105 in FIG. 2b, reduces the influence of variations in the depletion layer thickness surrounding the drain extension, on the effective channel length. The reduced sidewall area of the drain extension 107, for the lateral surfaces parallel with the plane of FIG. 2b, reduces the capacitive coupling between drain extension 107 and the substrate 102. These structural improvements increase the upper cut-off frequency for the bucket brigade device as well as increasing the charge transfer efficiency thereof.

While the invention has been particularly shown and described with reference to the preferred embodiments thereof it will be understood by those skilled in the art that the foregoing and other changes in form and details may be made therein without departing from the spirit and scope of the invention.

We claim:

1. In a bucket brigade device including a series connected arrangement of cells all in a semiconductor substrate with each cell including a storage means for storing a charge signal and a transfer means connected to a source of periodic voltage pulses for transferring said stored charge signal in said substrate to the next series connected cell in the bucket brigade device in response to said periodic voltage pulses, each of said cells having a structure comprising:
 (a) a semiconductor substrate of a first conductivity type, having a surface;
 (b) a first diffusion region of a first cell, of a second conductivity type having a thickness in said surface of said substrate;
 (c) a second diffusion region for a second cell serially connected and adjacent to said first cell, of said second conductivity type, spaced from said first diffusion region, having a thickness in said surface of said substrate;
 (d) an ion-implanted drain region for said first cell of said second conductivity type, located between said first and second diffusion regions, adjacent to and serially connected with said second diffusion region and spaced from said first diffusion region forming an asymmetric channel region in said substrate between an unimplanted surface adjacent to said first diffusion and the implanted surface of said ion-implanted drain region adjacent to said second diffusion, having a thickness less than that for said first and second diffusion regions in said surface of said substrate;
 (e) a thin insulating layer lying on the surface of said substrate over said channel and ion-implanted drain regions;
 (f) a thick insulating layer lying on the surface of said substrate over said first and second diffusion regions;
 (g) a gate conductor layer lying over said thin insulating layer;
said bucket brigade device cell being formed as a merged charge storage capacitor and FET structure having a threshold voltage whose sensitivity to the source-to-drain potential is reduced yielding a high charge transfer efficiency, the cell being denser due to the superposition of the drain region which serves as the capacitor, and the thin insulating layer and a reduced parasitic capacitance to the substrate due to the reduced sidewall area of the ion-implanted drain region.

2. The structure of claim 1, wherein said first conductivity type is p-type and said second conductivity type is n-type.

3. The structure of claim 1, wherein said first conductivity type is n-type and said second conductivity type is p-type.

4. The structure of claim 1, wherein the thickness of said ion-implanted drain region is between 500 Angstroms and 2000 Angstroms.

5. The structure of claim 1, wherein the thickness of said thin insulating layer is uniform across said channel and ion-implanted regions.

6. The structure of claim 1, wherein said concentration of conductivity enhancing dopant of said first type in said substrate yields a resistivity of between 1.3 ohm cm and 1.7 ohm cm.

7. The structure of claim 6, wherein the p-n junction depth with respect to surface of said substrate, of said diffusion regions is greater than 1.5 microns.

8. A cell structure for a bucket brigade device having a serially connected sequence of such cells, comprising:
 (a) a semiconductor substrate of a first conductivity type, having a surface;
 (b) a first diffusion region of a first cell, of a second conductivity type having a thickness in said surface of said substrate;
 (c) a second diffusion region for a second cell, of said second conductivity type, spaced from said first diffusion region, having a thickness in said surface of said substrate;
 (d) an ion-implanted drain region for said first cell of said second conductivity type, located between said first and second diffusion regions, adjacent to and serially connected with said second diffusion region and spaced from said first diffusion region forming a channel region therebetween having a thickness less than that for said first and second diffusion regions in said surface of said substrate;
 (e) a thin insulating layer lying on the surface of said substrate over said channel and ion-implanted drain regions;
 (f) a thick insulating layer lying on the surface of said substrate over said first and second diffusion regions;
 (g) a gate conductor layer lying over said thin insulating layer;
 (h) said concentration of conductivity enhancing dopant of said first type in said substrate yielding a resistivity of between 1.3 ohm cm and 1.7 ohm cm;
 (i) said p-n junction depth with respect to surface of said substrate, of said diffusion regions being greater than 1.5 microns;
 (j) the dose of conductivity enhancing dopant of said second type in said ion-implanted drain region being about $10^{13}$ atoms/cm$^2$;

whereby a bucket brigade device cell is formed with a merged charge storage capacitor and FET structure having a threshold voltage whose sensitivity to the source-to-drain potential is reduced yielding a high charge transfer efficiency, the cell being denser due to the superposition of the drain region which serves as the capacitor, and the thin insulating layer and a reduced parasitic capacitance to the substrate due to the reduced sidewall area of the ion-implanted drain region.

9. The structure of claim 8, wherein the distance between proximate edges of said first and second diffusion regions is about 13 microns, the thickness of said ion-implanted drain extension is between 500 Angstroms and 2000 Angstroms, and the length of said channel region is about 5 microns.

10. In a bucket brigade device including a series connected arrangement of cells all in a semiconductor substrate with each cell including a storage means for storing a charge signal and a transfer means connected to a source of periodic voltage pulses for transferring said stored charge signal in said substrate to the next series connected cell in the bucket brigade device in response to said periodic voltage pulses, each of said cells having a structure including a semiconductor substrate of a first conductivity type, having a surface; a first diffusion region of a first cell, of a second conductivity type having a thickness in said surface of said substrate; a second diffusion region for a second cell serially connected and adjacent to said first cell, of said second conductivity type, spaced from said first diffusion region, having a thickness in said surface on said substrate; a thick insulating layer lying on the surface of said substrate over said first and second diffusion regions; a thin insulating layer lying on the surface of said substrate between the first and second diffusion regions; a gate conductor layer lying over said thin insulating layer; wherein the improvement comprises:

an ion-implanted drain region for said first cell of said second conductivity type, located between said first and second diffusion regions, adjacent to and serially connected with said second diffusion region and spaced from said first diffusion region forming an asymmetric channel region in said substrate between an unimplanted surface adjacent to said first diffusion and the implanted surface of said ion-implanted drain region adjacent to said second diffusion, having a thickness less than that for said first and second diffusion regions in said surface of said substrate;

said bucket brigade device cell being formed as a merged charge storage capacitor and FET structure having a threshold voltage whose sensitivity to the source-to-drain potential is reduced yielding a high charge transfer efficiency, the cell being denser due to the superposition of the drain region which serves as the capacitor, and the thin insulating layer and a reduced parasitic capacitance to the substrate due to the reduced sidewall area of the ion-implanted drain region.

* * * * *